United States Patent
Hachuda (10) Patent No.: US 8,051,731 B2
(45) Date of Patent: Nov. 8, 2011

(54) SPRING REACTION FORCE CONVERTING APPARATUS

(75) Inventor: Osamu Hachuda, Kawaguchi (JP)

(73) Assignee: Enplas Corporation, Kawaguchi-shi, Saitama-ken (JP)

( * ) Notice: Subject to any disclaimer, the term of this patent is extended or adjusted under 35 U.S.C. 154(b) by 593 days.

(21) Appl. No.: 12/050,851

(22) Filed: Mar. 18, 2008

(65) Prior Publication Data

US 2008/0229852 A1 Sep. 25, 2008

(30) Foreign Application Priority Data

Mar. 19, 2007 (JP) .................................. 2007-071216

(51) Int. Cl.
*F16F 15/00* (2006.01)
(52) U.S. Cl. .......... 74/106; 248/575; 248/591; 248/593; 267/70; 267/103
(58) Field of Classification Search .................... 74/106; 248/575, 584, 585, 586, 589, 591–594; 267/70–72, 267/75, 103, 131
See application file for complete search history.

(56) References Cited

U.S. PATENT DOCUMENTS

| 1,893,295 | A | * | 1/1933 | Le Bailly | 248/586 |
| 3,118,643 | A | * | 1/1964 | Suozzo | 248/589 |
| 3,799,728 | A | * | 3/1974 | Howard | 425/416 |
| 4,589,621 | A | * | 5/1986 | Hunt et al. | 248/586 |

FOREIGN PATENT DOCUMENTS

JP 2003-332010 11/2003

* cited by examiner

*Primary Examiner* — William C Joyce
(74) *Attorney, Agent, or Firm* — McDermott Will & Emery LLP (57) ABSTRACT

A spring reaction force converting apparatus has first and second members arranged to be in parallel with and opposed to each other and to be capable of being moved toward and apart from each other, a spring element arranged to be extended between the first and second members in parallel thereto, a link mechanism holding the spring element between the first and second members such that the spring element is capable of being expanded and contracted, the link mechanism being connected to the first and second members; a stopper member maintaining the spring element held by the link mechanism in a condition in which the spring element is compressed by a predetermined amount in an initial condition, and an arrangement thereof in which a reaction force of the spring element is converted to a different type of force transmitted to the first and second members through the link mechanism.

1 Claim, 9 Drawing Sheets

(PRIOR ART)

SPRING REACTION FORCE CONVERTING APPARATUS

BACKGROUND OF THE INVENTION

1. Field of the Invention

The present invention generally relates to an apparatus incorporating therein opposing two members and a spring element or elements interposed therebetween for converting a reaction force of the spring element that generates when the two members are moved toward or away from each other by an operation force applied to the two members from the outside, to a different type of force enabling the apparatus to exhibit a novel working function. More particularly, the present invention relates to a spring reaction force converting apparatus of the above-described configuration, which is capable of converting the reaction force of the spring to a different type force transmitted to the two members through a link mechanism during applying of an operation force to the two members, thereby reducing the operation force applied to the two members gradually from a large value at its initial time to a smaller value at a time of termination of application.

2. Description of the Related Art

Hitherto, an IC socket for use in connecting an electronic part such as an IC package to a circuit substrate has been constructed to include: a mount on which an electronic part or parts is mounted; a socket main body on which the mount is securely mounted; a cover member provided to be vertically movable with respect to the socket main body; a pressure applying mechanism for holding the electronic part or parts mounted on the mount; and a plurality of electric contacts to be connected to the electronic parts. The pressure applying mechanism has a pressure applying lever supported to be rotatable with respect to the socket main body and the socket main body is provided with two or four coil springs disposed to push up the cover member (see for example, Japanese Laid-open (Kokai) Patent Application Publication No. 2003-332010).

Figure 9:
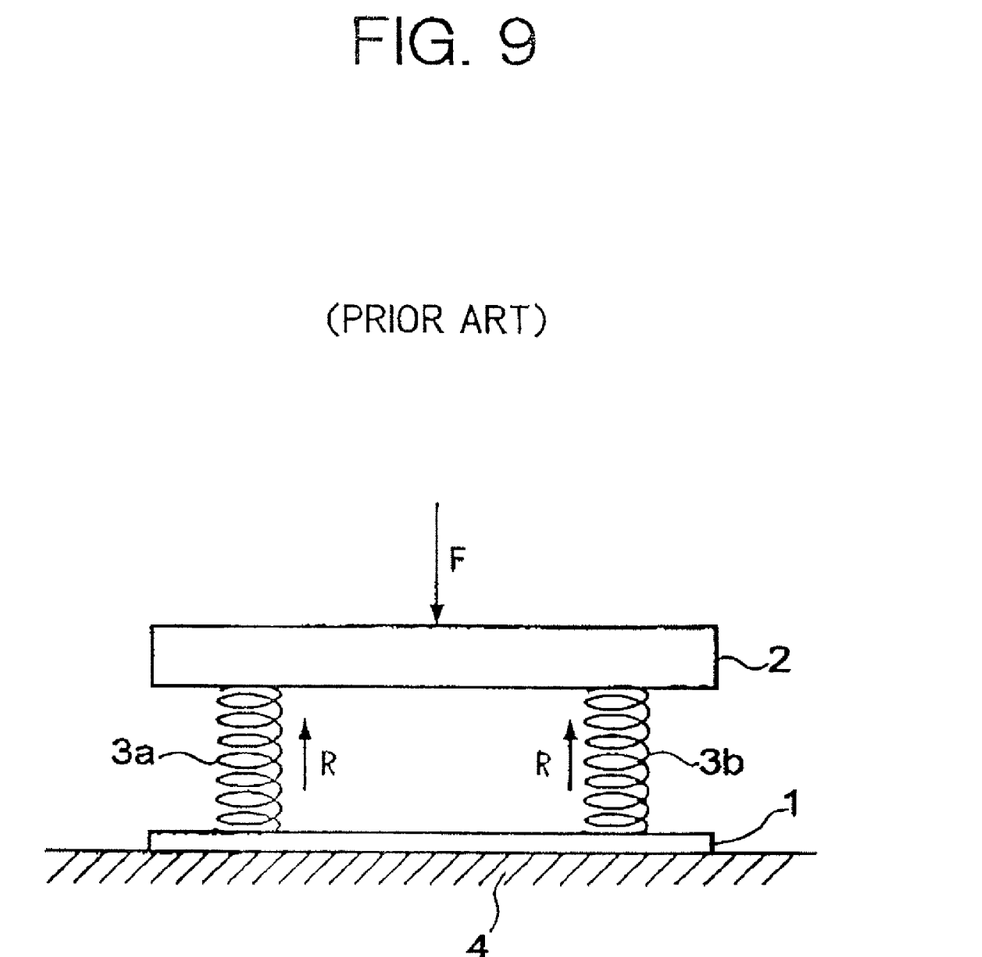
FIG. 9 is a schematic view illustrating and explaining a socket main body and a cover member of a conventional IC socket.

The socket main body and the cover member of the above-mentioned IC socket can be typically illustrated as shown in FIG. 9, in which a cover member 2 is disposed to be vertically movable above the socket main body 1, and two coil springs 3a, 3b are provided between both the socket main body 1 and the cover member 2 at both ends so that the cover member 2 is urged upward by the coil springs 3a, 3b. Thus, when the cover member 2 is pushed down against the elastic force of the coil springs 3a, 3b, activation of the pressure applying lever of a pressure applying mechanism (not shown in the figure) occurs.

However, in such a conventional structure of the socket main body and the cover member, when an operation force F is applied downwardly from above the cover member 2 as indicated with an arrow, with the socket main body 1 mounted on the circuit substrate 4, the cover member 2 is lowered so that the coil springs 3a, 3b are contracted and a reaction force R directed upward is generated by the coil springs 3a, 3b as indicated with arrows. At this time, the coil springs 3a, 3b are directly connected at opposite ends thereof to the socket main body 1 and the cover member 2 in a condition where these coil springs are arranged perpendicularly to the socket main body 1 and the cover member 2, so that the downward directed operation force F to the cover member 2 and the reaction force R of the coil springs 3a, 3b act toward opposite directions while opposing each other.

With such a state, as the cover member 2 is pressed further, the reaction force R of the coil springs 3a, 3b increases and as the pressing of the cover member 2 is released, the reaction force R of the coil springs 3a, 3b decreases. In this case, as the cover member 2 is lowered, the operation force F applied from above to the cover member 2 increases and as the cover member 2 is raised and upwardly moved, the operation force F applied to the cover member 2 decreases. In other words, in an operation of mounting the electronic part or parts on the mount of the socket main body 1, in an initial period of pushing down the cover member 2, the operation force F is small and feeling of the operation for applying the force F is sensed by an operator to be light, and in the period of termination of mounting the electronic part by pushing down the cover member 2, the operation force F increases and the feeling of the operation is sensed by the operator to be heavier. Therefore, as a whole, the operability is poor.

With the electronic part or parts mounted on the mount of the socket main body 1, the cover member 2 is upwardly moved, so that the mounted electronic parts are held as they are by a pressure application lever of the pressure applying mechanism. At this time, as the cover member 2 is upwardly moved to be further raised above, the reaction force R of the coil springs 3a, 3b decreases, and as a result, holding of the electronic parts by the pressure application mechanism must be weakened.

SUMMARY OF THE INVENTION

The present invention was made to address the above-described problems and provide a spring reaction force converting apparatus by which a reaction force of springs generating when an operation force is applied to two members from the outside may be converted to a different type of force that is transmitted to the above-mentioned two members through a link mechanism, so that the operation force to be applied to the two members may be gradually decreased by virtue of the different type of force from the initial period of application of the operation force toward the period of termination even if the operation force is large at the initial period.

In order to achieve the above-described object, a spring reaction force converting apparatus according to the present invention includes: a first member and a second member which are arranged to be parallel with and opposed to each other and to be capable of being moved toward or apart from each other; a spring element which is arranged for being extended between the first and second members in parallel with these members; a link mechanism configured to hold the spring element between the first and second members to be free to expand and contract, the link mechanism being arranged to be in connection to the first and second members; a stopper member configured to maintain the spring element held by the link mechanism in a state where the spring element is compressed by a predetermined amount in an initial state; and an arrangement in which a reaction force exhibited by the spring element is transmitted to the first member and the second member, respectively, via the link mechanism.

With the above-described configuration of the spring force converting apparatus, the first member and second member are arranged to be parallel with and opposed to each other and to be capable of being moved closely toward or apart from each other; the spring element which is arranged for being extended between the first and second members in parallel with these members is held by the link mechanism arranged to be in connection to the first and second members such that the spring element is able to expand and contract; and the spring element held by the link mechanism is maintained in a state where the spring element is compressed by a predetermined amount by a stopper member in an initial state, Thus, the reaction force that is generated by the spring element by virtue of application of an operation force to at least one of the first member and the second member is converted to a different type of force transmitted to the first member and the second member through the link mechanism. Consequently, the operation force applied to either one or both of the two members can be gradually decreased toward a period of termination of application of the operation force, although it is large in an initial period of the application. The component in a vertical direction of the reaction force of the spring element received by the first member and the second member can be decreased gradually in the direction in which the two members are moved toward each other from a state where they are kept apart and can be increased gradually in a direction in which they are moved apart from each other from a state where they are proximate to each other. Thus, a feeling of an operation sensed by an operator upon moving the two members closely toward or apart from each other by applying the operation force to the two members is reversed in comparison with that sensed by the operator through the conventional apparatus, and as a result, the operability of the spring force converting apparatus of the present invention can be appreciably improved.

The spring is substantially comprised of a coil spring element. Therefore, the coil spring element is secured in an extended manner between the first member and the second member in parallel thereto. Thus, by disposing a substantially cylindrical coil spring element between the first member and the second member, the first member and second members can be moved so close toward each other that their opposing faces are in contact with one another.

Further, a core member configured to be capable of expanding and contracting may be provided for being inserted into a central axial portion of the coil spring, so that the coil spring may be connected to the link mechanism through the core member. Consequently, the coil spring can be arranged in an extended manner such that it is maintained between the first member and the second member in parallel thereto. In this case, by disposing a substantially cylindrical coil spring element between the first member and the second member, the first member and the second member can be moved so close toward each other that their opposing faces are in contact with one another.

The link mechanism may be configured to have four levers for connecting both end portions of the spring element to the first member and the second member. Consequently, the spring element is held between the first member and the second member such that the spring element can be expanded and contracted by the link mechanism having four levers, by which both end portions of the spring element are connected to the first member and the second member. As a result, the link mechanism is operated symmetrically with respect to the right-left direction on both end portions of the spring element.

The link mechanism may securely attach one end portion of the spring element to either one of the first member and the second member and may have two levers, by which the other end portion of the spring element is connected to the first member and the second member. Consequently, the spring element is held between the first member and the second member such that it can be expanded and contracted by the link mechanism securing one end portion of the spring element to either one of the first member and the second member and having the two levers by which the other end portion of the spring element is connected to the first member and the second member. Consequently, a reduction in the number of levers of the link mechanism can be achieved with certainty.

DESCRIPTION OF THE PREFERRED EMBODIMENTS

Hereinafter, embodiments of the present invention will be described in detail with reference to the accompanying drawings.

Figure 1:
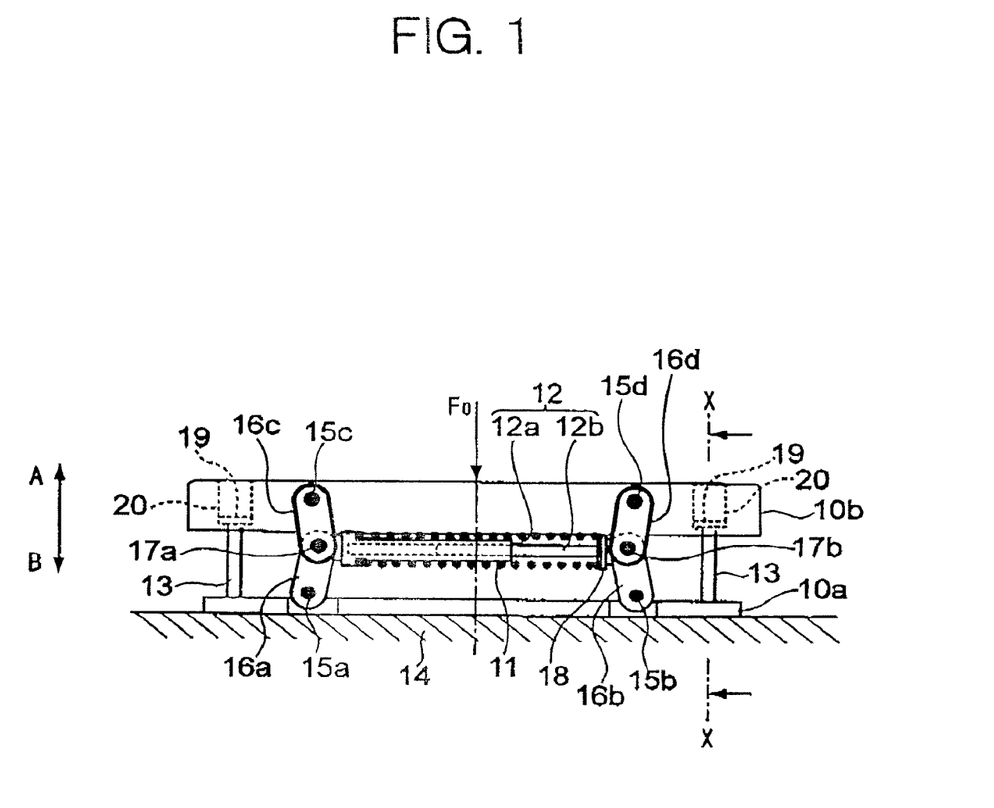
FIG. 1 is a front view illustrating an embodiment of a spring reaction force converting apparatus of the present invention.
Figure 2:
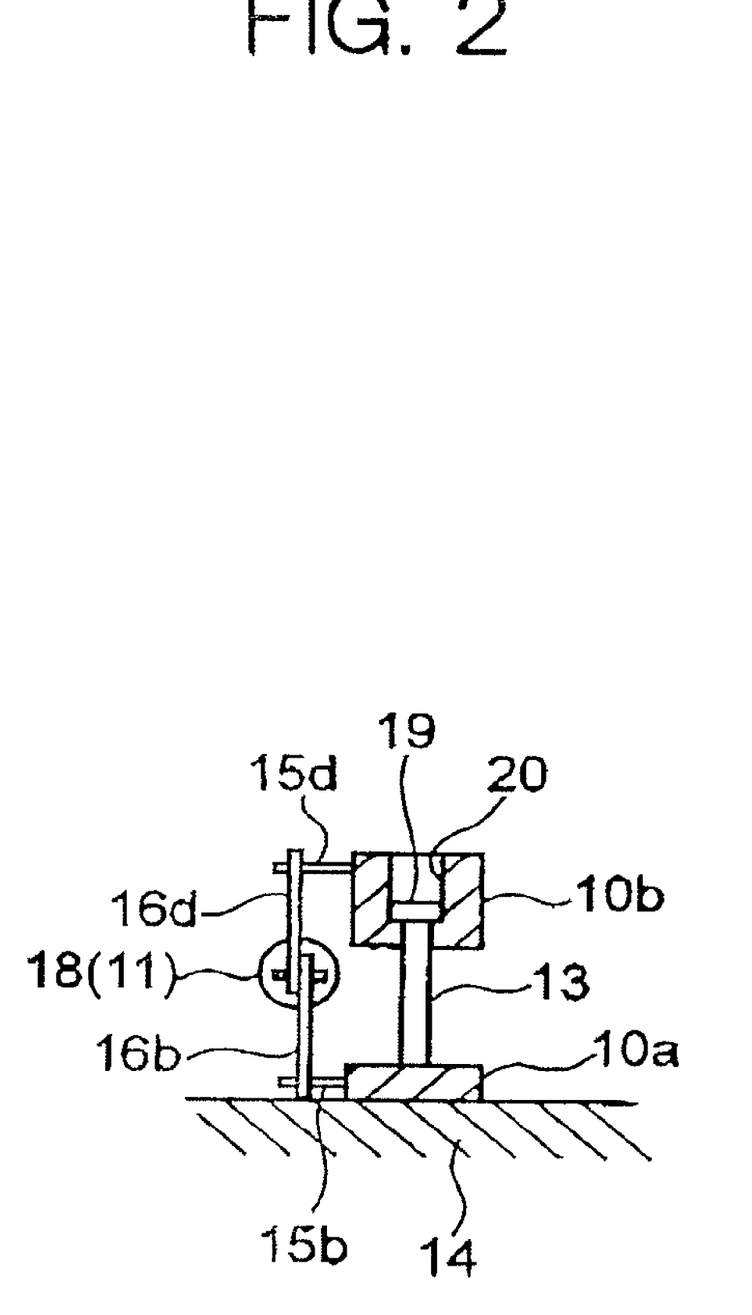
FIG. 2 is a sectional view taken along the line X-X.

FIG. 1 is a front view illustrating the embodiment of the spring reaction force converting apparatus of the present invention and FIG. 2 is a sectional view taken along the line X-X of FIG. 1. This spring reaction force converting apparatus is designed and constructed such that a spring element is interposed between opposing two members and a reaction force of the spring element generated when the two members are moved closely toward or apart from each other by an application of an operation force acting between the two members is converted, and further the spring reaction force converting apparatus includes a first member 10a, a second member 10b, a spring element 11, a core member 12, a link mechanism having later-described lever members 16a, 16b, 16c and 16d, and a stopper member 13.

The first member 10a and the second member 10b are provided for constituting major portions of the spring reaction force converting apparatus. The first member 10a is formed into, for example, an elongate sheet and mounted on a mounting base 14 while the second member 10b is formed into, for example, an elongate columnar member and disposed above the first member 10a. Then, the first member 10a and the second member 10b are disposed to be opposed to each other and arranged in parallel with one another. The first and second members 10a and 10b can be moved closely toward or apart from each other by the spring element 11 and the link mechanism, which are described later.

Between the first member 10a and the second member 10b, the spring element 11 is extended due to a support by the link mechanism described later. This spring element 11 is provided for urging the first member 10a and the second member 10b to be separated apart from each other. The spring element 11 is formed of, for example, a coil spring member having a predetermined length and disposed in a stretched manner in parallel to the first member 10a and the second member 10b. Then, in a space of a central axial portion of the spring element 11 comprised of the coil spring member, the core member 12 of a predetermined length is interposed. This core member 12 is comprised of a rod member 12b which is telescopically combined with a cylindrical tubular member 12a so that the rod member 12b can be extended or contracted in a longitudinal direction thereof with respect to the cylindrical tubular member 12a. By inserting the core member 12 into the central axial portion of the spring element 11, the spring element 11 can extend or contract while keeping a rod-like configuration thereof.

Between the first and second members 10a, 10b and the spring element 11, there is provided the afore-mentioned link mechanism. This link mechanism is arranged to connect the spring element 11 to the first member 10a and the second member 10b and to hold the spring element 11 between the first member 10a and the second member 10b in a manner such that the spring element can expand or contract under such a condition that the spring element is in constantly parallel with the first and second members 10a and 10b. The link mechanism includes a first lever 16a and a second lever 16b each having a predetermined length, which are supported rotatably at one end portions thereof by supporting shafts 15a, 15b near both end portions of the front side face of the first member 10a, and a third lever 16c and a fourth lever 16d each having a predetermined length, which are supported rotatably at one end portions thereof by supporting shafts 15c, 15d near both end portions of the front side face of the second member 10b. Then, the other end portions of the first lever 16a and the third lever 16c are pivotably connected to one end portion of the spring element 11 by means of a pin 17a, and the other end portions of the second lever 16b and the fourth lever 16d are pivotably connected to the other end portion of the spring element 11 by means of a pin 17b. Consequently, as shown in FIG. 2, the spring element 11 is arranged to be shifted in a frontward by an appropriate distance from the front side faces of the first member 10a and the second member 10b, so that the spring element 11 is prevented from being abutted against the front side face of the first member 10a and the second member 10b.

At the stage of assembling the spring element 11 on the core member 12, an end portion of the spring element 11 on one of its opposite sides is brought into contact with a step portion formed in the left end portion of the cylindrical tubular member 12a as shown in FIG. 1, and the end portion of the spring element 11 on its other side is brought into contact with an end plate 18 provided on the right end portion of the rod 12b telescopically combined with the cylindrical tubular member 12a so that the spring element 11 is permitted to be positioned around an outer peripheral surface of the core member 12. With this condition, the other end portions of the first lever 16a and the third lever 16c are connected to the left end portion of the cylindrical tubular member 12a by means of the pin 17a, and the other end portions of the second lever 16b and the fourth lever 16d are connected to an end plate 18 on the right end portion of the rod 12b by means of the pin 17b. With the above-described structure, the spring element 11 comprised of the coil spring member is cooperatively connected to the link mechanism having link members 16a, 16b, 16c and 16d through the core member 12.

Referring further to FIG. 1, on each of the opposite end portions in a longitudinal spacing extending between the first member 10a and the second member 10b, there is arranged a stopper member 13. This stopper member 13 maintains the spring element 11 held by the link mechanism having four levers 16a through 16d in a state in which the spring element 11 is compressed at its initial condition by a predetermined amount. Each of the stopper members 13 is formed into, for example, a rivet shape having a predetermined length of round rod with a head portion 19 attached to the top end of the round rod. Then, a lower end portion of the stopper member 13 is securely fixed to the first member 10a. On the other hand, a top end portion of the stopper member 13 penetrates a through-hole bored in a bottom portion of a concave portion 20 that is recessed in the second member 10b to have a predetermined depth less than the thickness of the second member 10b, and the head portion 19 of the above-mentioned top end portion is engageably seated in the bottom portion of the concave portion 20. Consequently, the second member 10b is vertically movable in the direction of arrows A, B indicated in FIG. 1 along the stopper member 13.

In this case, the distance from the lower end portion of the stopper member 13 up to the head portion 19 is determined to obtain a state in which the second member 10b is lowered by a predetermined amount in the direction of the arrow B toward the first member 10a in order to maintain the spring element 11 in such state that the spring element is compressed by a predetermined amount in the initial condition. Thus, the first and third levers 16a, 16c and the second and fourth levers 16b, 16d are kept bent inward in their centers in the initial condition, so that a predetermined amount of reaction force is generated by the spring element 11 in a direction parallel to the first member 10a and the second member 10b.

With such a structure, as shown in FIG. 1, when an operation force $F_0$ is applied downward to the top face of the second member 10b as indicated with an arrow, the second member 10b is moved down in the direction of an arrow B, so that the spring element 11 is contracted through the link mechanism (16a, 16b, 16c, 16d) and a reaction force of the spring element 11 by the operation force $F_0$ applied to the second member 10b is converted to a force transmitted to the first member 10a and the second member 10b through the link mechanism (16a, 16b, 16c, 16d).

Figure 3:
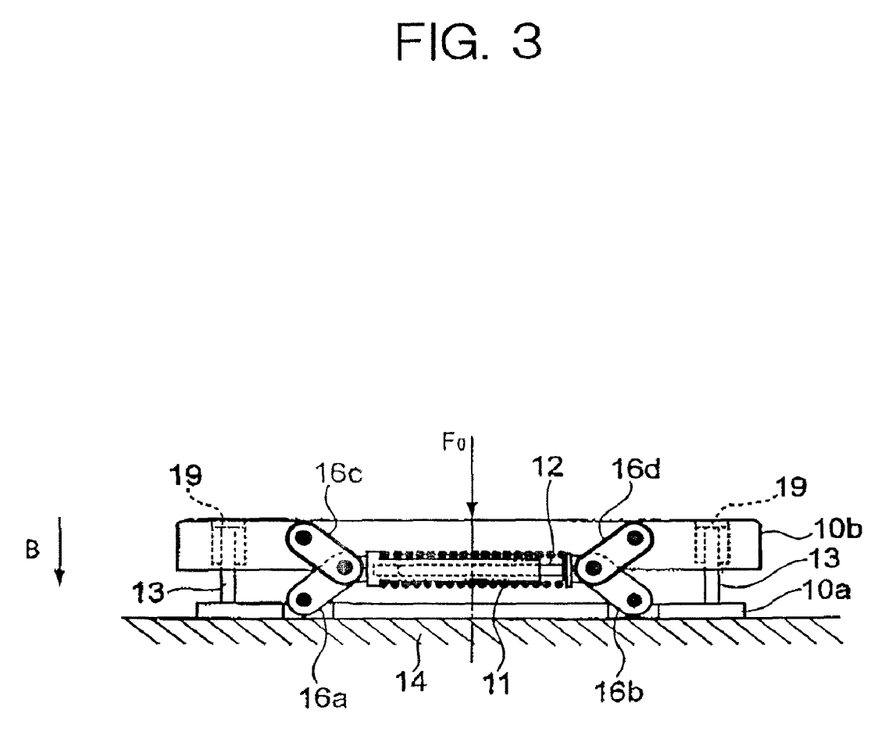
FIG. 3 is a view similar to FIG. 1, illustrating and explaining the motion of a link mechanism and contraction of a spring when an operation force is applied to a second member.

When the operation force $F_0$ is additionally applied to the second member 10b from the state of FIG. 1, the second member 10b is moved down in the direction of the arrow B as shown in FIG. 3 so as to contract the spring element 11 through the link mechanism (16a, 16b, 16c, 16d). At this time, the first and third levers 16a, 16c and the second and fourth levers 16b, 16d are pivoted to be bent a lot inwardly in their centers so as to permit the spring element 11 to generate a reaction force appreciably larger than in FIG. 1.

Figure 4:
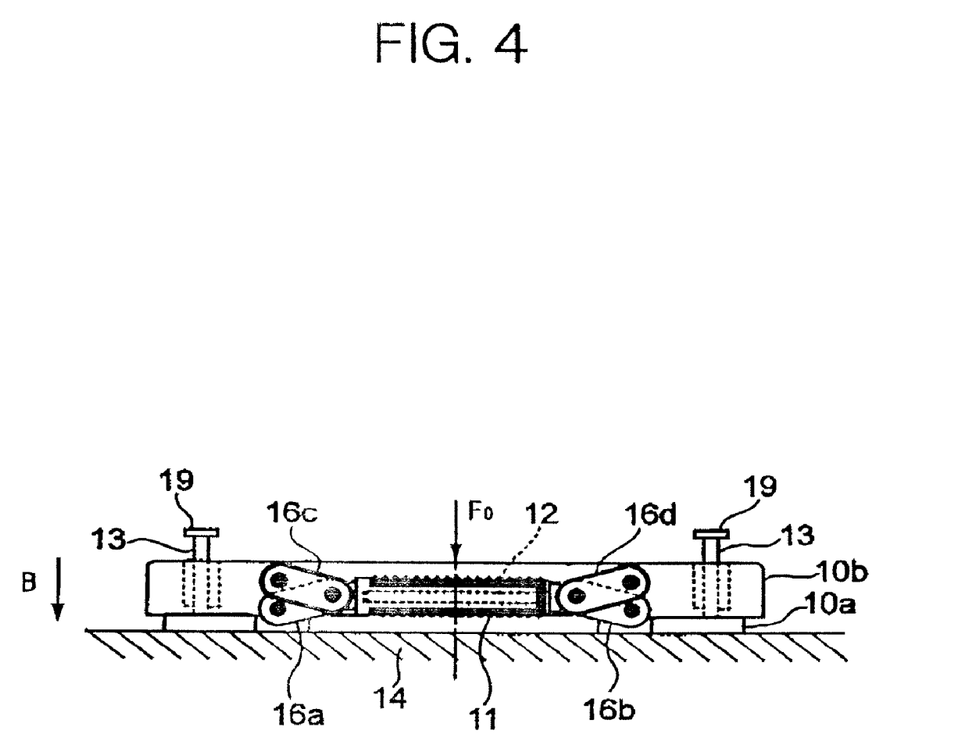
FIG. 4 is a view similar to FIGS. 1 and 3, illustrating the motion of the link mechanism and the contraction of the spring when a more amount of operation force is applied to the second member.

When the operation force $F_0$ is applied to the second member 10b from the state of FIG. 3, the second member 10b is lowered further in the direction of the arrow B as shown in FIG. 4 to further contract the spring element 11 through the link mechanism (16a, 16b, 16c, 16d). Hence, the bottom face of the second member 10b finally comes into contact with the top face of the first member 10a so that the first and third levers 16a, 16c and the second and fourth levers 16b, 16d are pivoted to be furthermore bent inward about their centers, so that a larger reaction force than in FIG. 3 is generated by the spring element 11. In this state, the head portion 19 of each stopper member 13 comes upward beyond the top face of the second member 10b.

After that, when the operation force $F_0$ applied to the second member 10b is reduced or removed from the state of FIG. 4, the second member 10b is moved back in the upward direction of an arrow A (FIG. 1) by a force converted from the reaction force of the spring element 11 via the link mechanism (16a, 16b, 16c, 16d) and restored to its original state. At this time, the head portion 19 of the stopper member 13 comes into engagement with the bottom portion of the concave portion 20 in the second member 10b, so that the second member 10b is stopped in a condition in which the second member 10b is lowered by a predetermined amount in the direction of the arrow B toward the first member 10a. Thus, the spring element 11 is maintained in a condition in which the spring element 11 is compressed by a predetermined amount to generate a predetermined amount of reaction force.

Next, in the spring reaction force converting apparatus having the described structure, the relationship between the operation force $F_0$ applied to the first member 10a and/or the second member 10b and the reaction force of the spring element 11 will be described with reference to the diagrammatic view of FIG. 5.

Figure 5:
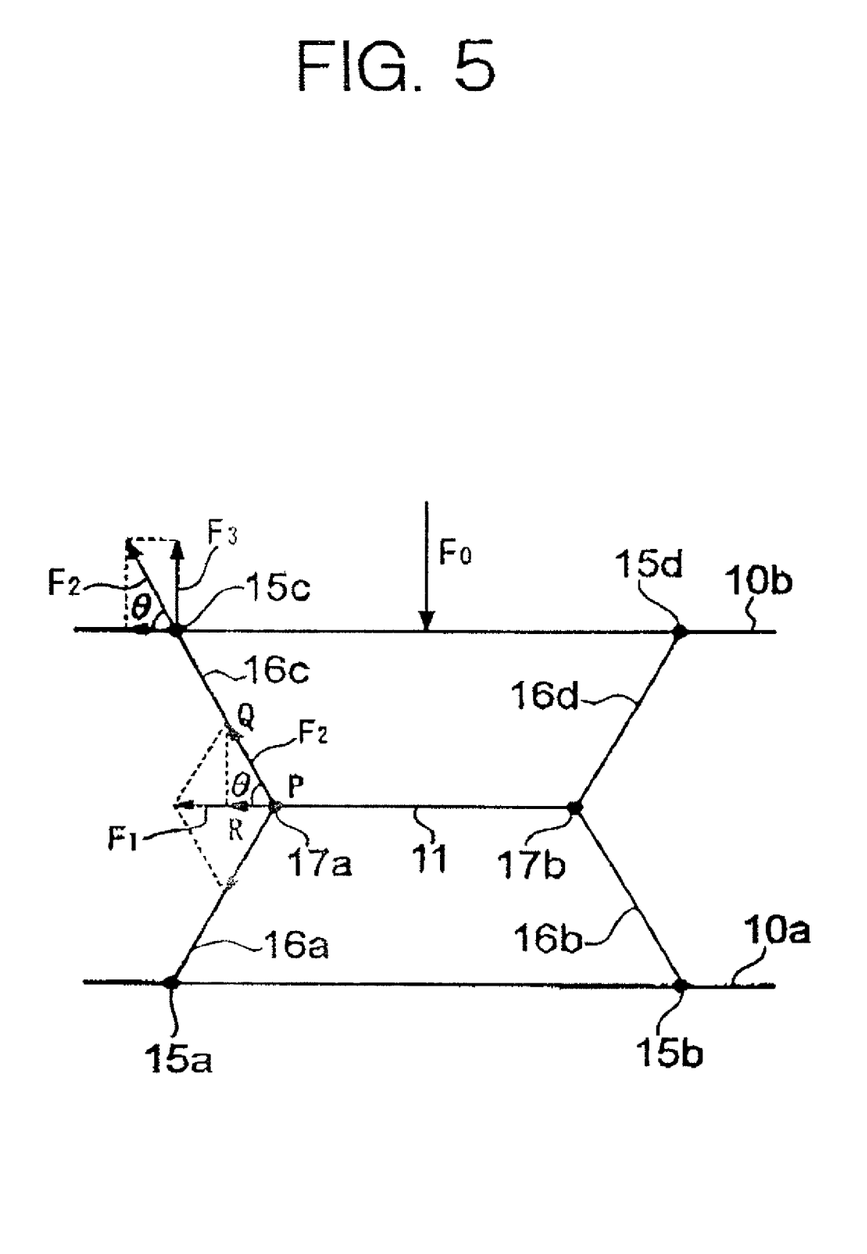
FIG. 5 is an explanatory diagram illustrating the relationship between the operation force applied to the first member and the reaction force of the spring.

It should be understood that in FIG. 5, respective components are expressed with straight solid lines and supporting shafts and pins are represented with black circles to simplify the representation. Like in FIG. 1, the first member 10a is secured, and the second member 10b is lowered toward or raised from the first member 10a.

In FIG. 5, assume that the operation force $F_0$ directed downward is applied to the central portion of the top face of the second member 10b. This operation force $F_0$ is transmitted to the spring element 11 through the link mechanism (16a, 16b, 16c, 16d) so as to contract the spring element 11. Here, by paying attention to the third lever 16c connected to the pin 17a of the spring element 11 as a representative, a force acting on the supporting shaft 15c by which the third lever 16c is connected to the second member 10b is obtained. A reaction force of the spring element acting on the pin 17a, i.e., $F_1$, is provided by the following equation:

$$F_1 = kx \quad (1)$$

where a spring constant of this spring element 11 is k, and an amount of contraction is x.

With the reaction force $F_1$ generated by the spring element 11, the reaction force $F_1$ of the spring element 11 can be divided into a component force along the third lever 16c and a component force along the first lever 16a at the position of the pin 17a. Namely, conversion of the reaction force $F_1$ takes place. The component force along the first lever 16a and the component force along the third lever 16c form a parallelogram as shown in the diagram. The component force along the third lever 16c is represented by $F_2$. Then, the angle formed by the component force $F_2$ along the third lever 16c and the reaction force $F_1$ of the spring element acting along a line of extension of the spring element 11 is represented by θ. Now, when the position of the pin 17a is designated at P, the position indicating the magnitude of the component force $F_2$ along the third lever 16c is Q and the position of a foot of a perpendicular line falling onto the line indicating the reaction force $F_1$ from the point Q is R, the component force $F_2$ is expressed as:

$$F_2 = (F_1/2)/\cos\theta \quad (2)$$

because PQ=$F_2$, PR=$F_1$/2, and ∠QPR=θ in △PQR.

The component force $F_2$ expressed by the equation (2) is transmitted in its entirety to the supporting shaft 15c which is an intersection with the second member 10b through the third lever 16c. In this case, because the direction of the reaction force $F_1$ of the spring element 11 is in parallel to the second member 10b and the component force $F_2$ along the third lever 16c intersects the second member 10b at an angle θ, only the component force $F_2$ is applied to the supporting shaft 15c in the direction of the angle θ. Then, an upward component of this component force $F_2$ perpendicular to the second member 10b is represented by $F_3$. Here, a triangle having its apex at the supporting shaft 15c is taken into consideration, the upward component $F_3$ converted from the reaction force $F_1$ of the spring element 11 can be expressed as follows.

$$F_3 = F_2 \cdot \sin\theta \quad (3)$$

By substituting the above equation (2) into this equation (3), $$F_3 = (F_1/2)\tan\theta \quad (4)$$

is obtained.

This equation (4) indicates the magnitude of the upward force $F_3$ acting on a point of the supporting shaft 15c which the third lever 16c is coupled with, when the operation force $F_0$ directed downward is applied to the top face of the second member 10b. The same force is applied to points of the other supporting shafts 15a, 15b and 15d likewise. According to the equation (4), the upward force $F_3$ is naturally proportional to the reaction force $F_1$ of the spring element 11 and tan θ. Assuming that the reaction force $F_1$ of the spring element 11 does not largely change, according to the equation (4), as the angle θ is decreased, the upward force $F_3$ is decreased, whereas as the angle θ is increased, the upward force $F_3$ is increased. Thus, when the second member 10b is moved down by applying the downward operation force $F_0$ to the top face of the second member 10b, the operation force $F_0$ can be gradually decreased toward the period of termination of the application of the operation force although it is large in the initial period of the application of the operation force for lowering of the second member 10b. In other words, the upward component $F_3$ that is converted from the reaction force $F_1$ of the spring element 11 and received by the second member 10b can be gradually decreased in a direction in which the two members 10a, 10b approach each other from a state in which they are apart and can be increased gradually in a direction in which they leave from each other from the state in which they are in a proximity to each other.

Figure 6:
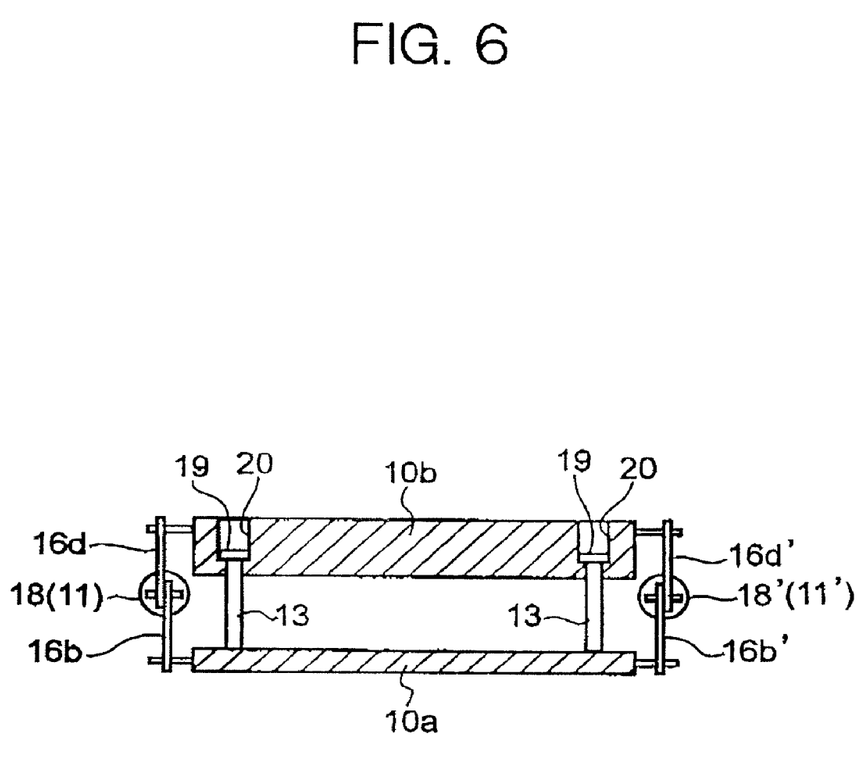
FIG. 6 is a cross-sectional view taken along the line X-X of FIG. 1, illustrating a second embodiment of the spring reaction force converting apparatus of the present invention.

FIG. 6 is a cross-sectional view taken along the line X-X showing the second embodiment of the spring reaction force converting apparatus of the present invention. According to this embodiment, the first member 10a and the second member 10b are formed into a rectangular shape such as square, rectangle and the like. The link mechanism (16a, 16b, 16c, 16d) and the spring element 11 are provided on the front side face of the first member 10a and the second member 10b, while a link mechanism (16a', 16b', 16c', 16d') and a spring element 11' are provided on the rear side face of the first member 10a and the second member 10b. In this case, a spring reaction force converting apparatus can be provided, which may be used with a spring portion of a targetted apparatus of larger-scale.

Figure 7:
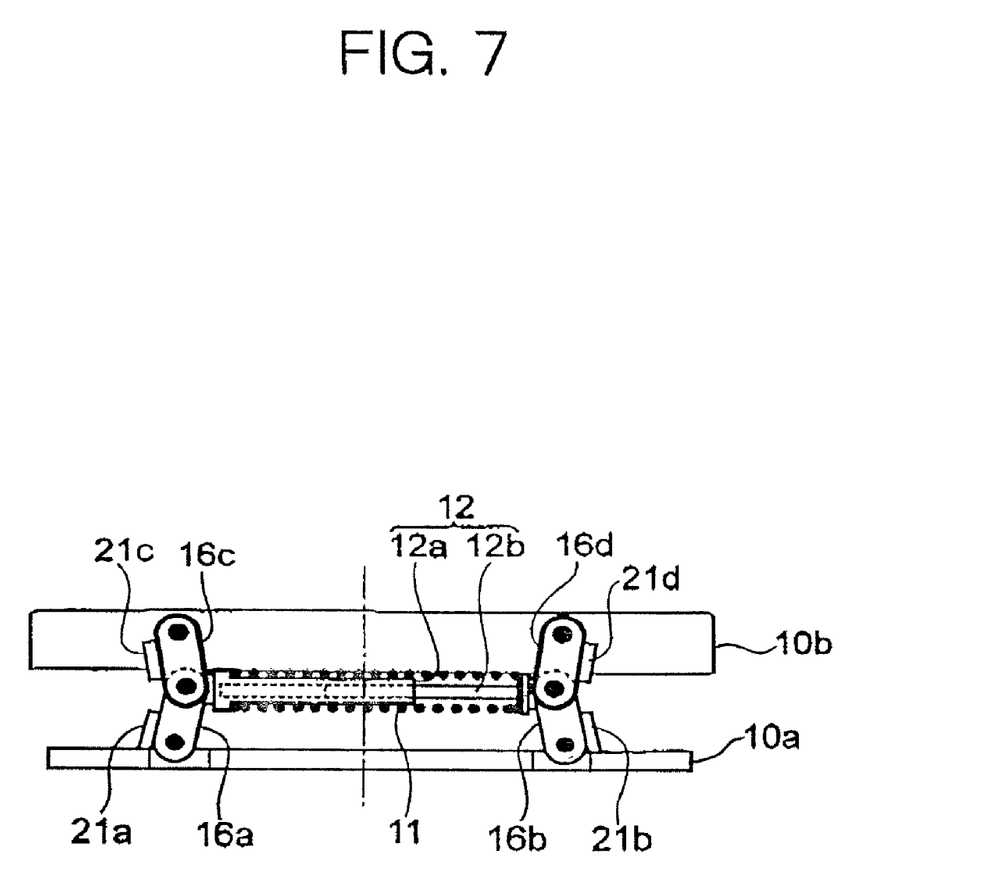
FIG. 7 is a front view illustrating a third embodiment of the spring reaction force converting apparatus of the present invention.

FIG. 7 is a front view showing a third embodiment of the spring reaction force converting apparatus of the present invention. According to this embodiment, instead of providing the stopper member 13 upstanding from the first member 10a and concave portion 20 formed in the second member 10b, there are provided a first stopper piece 21a and a second stopper piece 21b for restricting the motion of the first lever 16a and the second lever 16b, and further, there are provided a third stopper piece 21c and a fourth stopper piece 21d for restricting the motion of the third lever 16c and the fourth lever 16d. In this case, the first stopper piece 21a and the second stopper piece 21b are attached to the first member 10a, and the third stopper piece 21c and the fourth stopper piece 21d are attached to the second member 10b. The mounting angles of the stopper pieces 21a, 21b, 21c, 21d are determined so as to maintain the spring element 11 held by the link mechanism (16a, 16b, 16c, 16d) in a condition in which the spring element 11 is compressed by a predetermined amount in the initial condition similar to that shown in FIG. 1, and the stopper pieces 21a, 21b, 21c, 21d make contact with the outer side faces of the levers 16a, 16b, 16c, 16d so that the motions thereof are restricted. Thus, the first land third levers 16a, 16c and the second and fourth levers 16b, 16d are kept bent slightly inward about their centers in the initial condition, and a reaction force of a predetermined amount is generated by the spring element 11 in parallel to both of the first member 10a and the second member 10b.

Figure 8A:
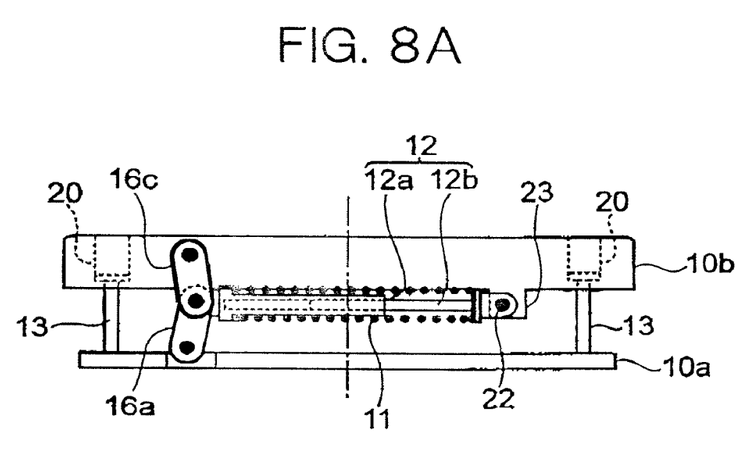
FIGS. 8A and 8B are front views illustrating of the spring reaction force converting apparatus and its slight modification according to a fourth embodiment of the present invention.
Figure 8B:
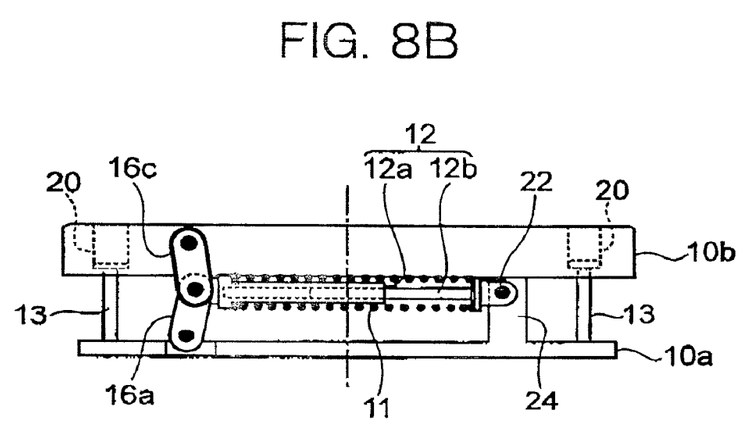

FIG. 8 is a front view showing the fourth embodiment of the spring reaction force converting apparatus of the present invention. According to the embodiment, the link mechanism holding the spring element 11 such that it can be expanded or contracted between the first member 10a and the second member 10b as shown in FIG. 1, is configured that, as shown in FIG. 8, one end portion of the spring element 11 is secured to either one of the first member 10a and the second member 10b and is provided with two levers 16a, 16b by which the other end portion of the spring element 11 is connected to the first member 10a and the second member 10b. FIG. 8A shows an example that an end portion 22 of the spring element 11 is securely fixed to a fixing block 23 provided to be bulged project from the bottom face of the second member 10b. FIG. 8B shows an example that the end portion 22 of the spring element 11 is securely fixed to a fixing block 24 provided to be bulged from the top face of the first member 10a. In this case, the structure of the link mechanism can be simplified.

Although in the above description of the diverse embodiments of the present invention, the first member 10a is securely fixed and the second member 10b is arranged to be movable vertically, the present invention is not limited to the embodiments but the same operation principle can be achieved in an inverse relation to the embodiment and the same effect is exerted. Further, although the expandable core member 12 is interposed in the central axial portion of the spring element 11 comprised of a coil spring member, the present invention is not limited to the embodiments but it is permissible not to insert the core member 12. Although in the foregoing description, the spring element 11 is comprised of a coil spring member, a spring element having any other shape and structure may be used. Further, in FIG. 1, for example, the lengths of the respective levers which constitute the link mechanism holding the spring element 11 such that it is expanded or contracted may be different between the levers 16a, 16b connected to the first member 10a and the levers 16c, 16d connected to the second member 10b. For example, the ratio of the lengths may be 1:2 instead of 1:1. In this case, the ratio between a force appearing on the first member 10a and a force appearing on the second member 10b can be changed.

In an electric component socket for use in connecting an electronic part such as an IC package to a circuit substrate, the spring reaction force converting apparatus of the present invention having such a structure may be used as a spring member disposed to raise the cover member with respect to the socket main body. In other product than the electric component socket, generally between two members or components, the present invention may be used as a spring member for connecting the two members or the components such that they can be brought close to or apart from each other.

I claim:

1. A spring reaction force converting apparatus comprising:
   a first member and a second member arranged to be parallel with and opposed to each other and to be capable of being moved toward or apart from each other;
   a spring member that has a coil spring member positioned between the first and second members and is arranged for being extended and compressed in a direction parallel to the first and second members, the coil spring member having a central portion in which a core member configured to be able to extend and contract is interposed;
   a link mechanism configured to hold the spring member between the first and second members such that the spring member is free to expand and contract, the link mechanism being arranged to be in connection to the first and second members, wherein the link mechanism includes a first set of end portions connected to both end portions of the core member of the spring member, a second set of end portions connected to the first member at two positions separated apart from each other by a distance greater than a length of the spring member, a third set of end portions connected to the second member at two positions separated apart from each other by a distance greater than a length of the spring member, and four levers for connecting both end portions of the spring member to the first member and the second member, and wherein the link mechanism is configured to move the first and second members toward or apart from each other while maintaining the first and second members to be in parallel with each other;
   a stopper member configured to maintain the spring member held by the link mechanism in a state where the spring member is compressed by a predetermined amount in an initial state; and
   an arrangement in which a reaction force exhibited by the spring member compressed by an operation force applied to the first and second members is transmitted to the first member and the second member, respectively, via the link mechanism, wherein as the first and second members move toward each other, the reaction force progressively decreases, and wherein as the first and second members move apart from each other, the reaction force progressively increases such that the operation force progressively decreases until a period of termination of the application of the operation force with respect to an initial period thereof.

* * * * *